United States Patent [19]

Faris et al.

[11] Patent Number: 4,885,480
[45] Date of Patent: Dec. 5, 1989

[54] SOURCE FOLLOWER FIELD-EFFECT LOGIC GATE (SFFL) SUITABLE FOR III-V TECHNOLOGIES

[75] Inventors: Aziz I. Faris, Upper Macungie Township, Lehigh County; Perry J. Robertson, Spring Township, Berks County, both of Pa.

[73] Assignee: American Telephone and Telegraph Company, AT&T Bell Laboratories, Murray Hill, N.J.

[21] Appl. No.: 235,862

[22] Filed: Aug. 23, 1988

[51] Int. Cl.[4] ............................................. H03K 19/94
[52] U.S. Cl. ................................... 307/448; 307/443; 307/446; 307/450; 307/570
[58] Field of Search ............... 307/443, 446, 448, 450, 307/475, 570, 581

[56] References Cited

U.S. PATENT DOCUMENTS

| | | | |
|---|---|---|---|
| 4,400,636 | 8/1983 | Andrade | 307/446 |
| 4,404,480 | 9/1983 | Ransom et al. | 307/450 X |
| 4,405,870 | 9/1983 | Eden | 307/450 X |
| 4,445,051 | 4/1984 | Elmasry | 307/448 X |
| 4,532,439 | 7/1985 | Koike | 307/450 |
| 4,590,393 | 5/1986 | Ransom et al. | 307/448 X |
| 4,639,621 | 1/1987 | Ikawa et al. | 307/450 |
| 4,644,189 | 2/1987 | Gabillard | 307/450 X |
| 4,698,524 | 10/1987 | Plagens | 307/450 |
| 4,713,559 | 12/1987 | Vu et al. | 307/446 |
| 4,724,342 | 2/1988 | Sato et al. | 307/450 |
| 4,725,743 | 2/1988 | Anderson | 307/450 |
| 4,800,303 | 1/1989 | Graham et al. | 307/450 |

OTHER PUBLICATIONS

"Push-Pull Output for a Three-Input NOR Logic Circuit Using GaAs MESFET", *IBM T.D.B.*, vol. 30, No. 10, Mar. 1988, pp. 112-113.

"Noise-Margin Limitations on Gallium-Arsenide VLSI", IEEE Journal of Solid-State Circuits, vol. 23, No. 4, Aug. 1988, Stephen I. Long, Mani Sundaram, pp. 893-900.

"GaAs Devices and Circuits", by Michael Shur-University of Minnesota, Plenum Press, New York and London, 1987, pp. 434-449.

*Primary Examiner*—David Hudspeth
*Attorney, Agent, or Firm*—S. W. McLellan

[57] ABSTRACT

A high speed logic circuit having extremely low propagation delays, suitable for implementation in III-V technology. A logic stage provides the desired logic function by combining a predetermined number of input FETs. The drains of the input FETs couple to a pull-up FET and form a first intermediate output of the logic stage. The sources of the input FETs couple to a pull-down FET and form a second intermediate output of the first stage. A second stage, or buffer stage, responding to the intermediate outputs of the first stage, provides sufficient drive to an output terminal of the logic gate to drive multiple loads (gates) coupled thereto. The second stage includes a pull-down FET responsive to the second intermediate output of the first stage. The second stage also includes alternative combinations of FETs and diodes to pull-up the voltage on the output terminal of the logic gate.

18 Claims, 2 Drawing Sheets

10

20

20

20

20

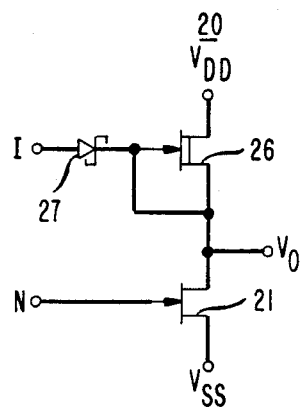
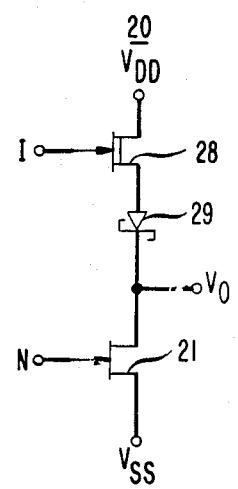
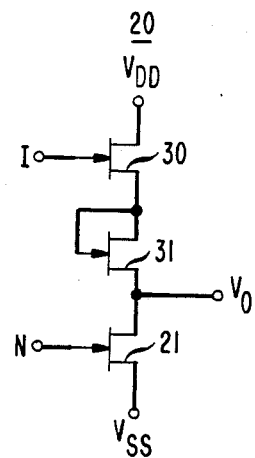

SOURCE FOLLOWER FIELD-EFFECT LOGIC GATE (SFFL) SUITABLE FOR III-V TECHNOLOGIES

BACKGROUND OF THE INVENTION

1. Field of the Invention

The present invention relates to logic gates generally and, more particularly, to logic gates integratable with III-V technologies such as in Gallium Arsenide (GaAs) integrated circuits.

2. Description of the Prior Art

Gallium Arsenide has long been recognized as material which could be used to integrate high-speed logic circuitry. However, due to inherent manufacturing difficulties associated with this kind of material, conventional logic circuits, i.e. those designed for integration into silicon, are not readily adaptable for integration into GaAs or other III-V materials such as Indium Phosphide. Consequently, several types of digital logic families were developed for use in GaAs integrated circuits. Exemplary common logic families are Buffered FET Logic (BFL), Direct Coupled FET Logic (DCFL), Schottky Diode FET Logic (SDFL) and Source-coupled FET Logic (SCFL). Each family is for the most part incompatible due to different logic voltage levels employed by each. Further, power dissipation, noise margins and propagation delay per gate varies widely from family to family. For example, BFL requires two bias voltages and suffers from high power dissipation. DCFL is a fast, relatively low power logic family but has small logic level voltage swings (typically 0.6 volts), resulting in small noise margins. SDFL is somewhat slower than DCFL but with better noise margins and higher power dissipation than DCFL. SCFL logic suffers from high power dissipation while providing high speed and large fan-out. These and other logic families are discussed in more detail in "GaAs Devices and Circuits", by Michael Shur, Plenum Press, 1987, pp. 434-449.

In Very Large Scale Integrated Circuits (VLSI) where many thousands of logic gates are utilized on a single wafer, the power dissipation of a logic gate becomes a major concern while still providing high speed. For example, the number of gates on a silicon VLSI chip using emitter-coupled logic is usually limited by the power dissipation of the chip. Consequently, for a GaAs VLSI chip, the most frequently utilized logic family is DCFL due to the relatively low power dissipation per DCFL gate. However, the small noise margins of DCFL, typically 0.2 volts, and small logic level voltage swings, typically 0.6 volts, greatly limits chip yield from a wafer. Wide variations in FET characteristics (parametrics) across a wafer, even across each chip, result in threshold voltage variations for the DCFL gates which significantly reduce, even eliminate, the noise margins. This, combined with the large amounts of electrical noise generated by the gates changing state, can disrupt operation of VLSI circuit designs. Hence, the limitation on the number of gates per GaAs chip using DCFL is limited not by power dissipation but by the desired chip yield of operable chips per wafer.

Therefore it is a primary object of this invention to provide a new logic family having high speed and low power dissipation compatible with large scale integration in III-V materials, such as Gallium Arsenide or Indium Phosphide.

A further object of the invention is to provide a logic family tolerant of device parametric variation with wide noise margins for use in high density VLSI chips and gate arrays without sacrificing speed or power dissipation.

SUMMARY OF THE INVENTION

These and other objects of the invention can be obtained generally by having a logic gate with an input stage and a buffer stage, the input stage including a logic stage responsive to logic signal inputs, for performing the required logic function. The logic stage has first and second output nodes and at least one enhancement FET per logic signal input. A first depletion FET, adapted to form a current source and disposed between the first output node of the logic stage and a first power source, forms a pull-up load for logic stage. A second depletion FET, adapted to form a current sink and disposed between the second output node of the logic stage and a second power source, forms a pull-down load for the logic stage.

The buffer stage has an enhancement FET, with a gate terminal coupling to the second output node of the logic stage, a first output terminal coupling to the second power source and a second output terminal coupling to the output node of the logic gate to pull-down the voltage thereon. In addition, the buffer stage includes alternative combinations of FETs and diodes to pull-up the voltage on the output node of the logic gate.

BRIEF DESCRIPTION OF THE DRAWING

The foregoing features of this invention, as well as the invention itself, may be more fully understood from the following detailed description of the drawings, in which:

FIGS. 2 through 8 are schematic diagrams of alternative buffer stages of the logic gate shown in FIG. 1.

DETAILED DESCRIPTION

Figure 1:
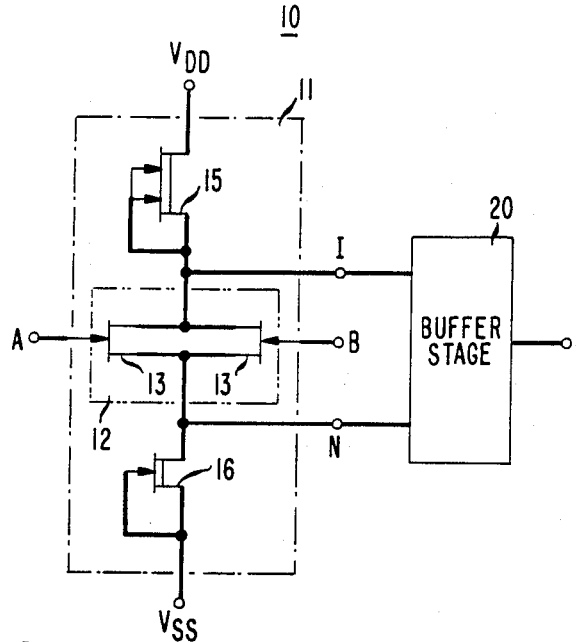
FIG. 1 diagrams the logic gate, according to the invention, having an input stage and a buffer stage, the input stage having a logic stage.

A novel logic gate 10, suitable for integration to a III-V type of compound semiconductor integrated circuits, consists of an input stage 11 and a buffer stage 20 as shown in FIG. 1. The input stage 11 is shown in schematic form with the buffer stage 20 shown as a block. Details of different implementations of the buffer stage 20 will be given in more detail below in connection with FIGS. 2 through 8, but it is sufficient to state here that buffer 20 provides sufficient drive capability for the logic gate 10 to drive multiple logic gates (not shown) coupled to output node $V_o$. Input stage 11 receives logic signals on a predetermined number of inputs, an exemplary two are shown here as logical inputs A, B. As will be explained in greater detail below, intermediate output nodes I, N have thereon the output of the input stage 11. Buffer 20 couples the signals on nodes I, N to output node $V_o$ of the logic gate 10.

It is noted here that the transistors shown in the given embodiments consist of enhancement and depletion field-effect transistors, referred to here as EFETs and DFETs, respectively. More particularly, the EFETs and DFETs are transistors implemented as N channel FETs in a III-V compound semiconductor technology, such as gallium arsenide (GaAs) or indium phosphide (InP) compounds. The structure of the EFETs and DFETs either have metal gates, commonly referred to as MESFETs, or diffused gates, commonly referred to as JFETs, or, preferably, a heterojunction FET, commonly referred to as HFETs, modulation-doped FETs (MODFETs) or high electron mobility transistor (HEMT). The EFETs are normally off devices, typically requiring approximately +0.2 volts between the gate and source terminals thereof to bring them into a conducting state. Conversely, DFETs are normally on devices requiring a reverse voltage of approximately −0.6 volts between the gate and source terminals thereof to substantially turn-off the devices. Although metal-oxide-semiconductor FETs (MOSFETs) in III-V technology are not available yet in manufacturable form, it is understood that the FETs shown herein can be MOSFETs. Further, although all FETs shown are N channel devices, P channel devices can be substituted with a corresponding change in polarity of the power sources $V_{DD}$ and $V_{SS}$.

The input stage 11 of logic gate 10 has a logic stage 12 consisting of at least one EFET 13 with common source and drain terminals. Individual gate terminals of the EFETs 13 couple to corresponding logic input terminals A, B to logically OR logic signals thereon. It is understood that instead of, or in addition to, paralleling EFETs 13, the EFETs 13 could be disposed serially, or with multiple gate terminals per EFET 13, to provide a logical AND function. Similarly, DFETs can be substituted for the EFETs in serial or parallel combination to perform the desired logic function.

The common drain terminals of EFETs 13 coupled to a first intermediate output node I of the input stage. DFET 15, is adapted to operate as a current source by having the gate and source terminals thereof coupled together and the drain terminal thereof coupled to $V_{DD}$, the most positive power source, typically 2.0 volts. DFET 15 thereby acts as a passive load by pulling up the voltage on node I to $V_{DD}$. Although shown as a dual gate DFET, it is understood that a single gate DFET can be substituted for dual gate DFET 15, but with higher power dissipation by the logic gate 10.

Similarly, DFET 16 is adapted to operate as a current sink by having the gate and source terminals thereof coupled to $V_{SS}$, the most negative supply voltage, typically at ground or zero volts. The drain terminal of DFET 16 couples to the common source terminals of the EFETs 13 of the logic stage 12 and to a second intermediate output terminal N of the input stage 11. DFET 16 thereby acts as a passive load by pulling down the voltage on node N to $V_{SS}$.

Intermediate outputs N, I are the logical inverse of each other; as shown, the N output represents the logical OR of the inputs A, B and the I output represents the logic NOR of the inputs A, B. As will be discussed in detail below, having two complementary outputs from the input stage 11 allows great flexibility in structuring the buffer stage 20 to optimize for speed or power dissipation of the logic gate 10.

Alternative buffer stages 20 of the logic gate 10 (FIG. 1) are shown in FIGS. 2 through 8. In each FIGS. 2–8, an EFET 21 is shown having a gate terminal coupled to the second intermediate output terminal N of the input stage 11 (FIG. 1) and the source thereof coupled to $V_{SS}$. The drain of EFET 21 couples to the output terminal $V_o$ of the buffer, also the output terminal of the logic gate 10 (FIG. 1). EFET 21 serves as a pull-down to the output node $V_o$.

The buffer stages 20 shown in FIGS. 2–8 are best described by way of example. As stated above, all buffers are shown having EFET 21 as the pulldown for the output node $V_o$. The remaining circuitry serves as a pull-up of the output node $V_o$, each type having a different advantage in speed or power dissipation.

It should be noted that not all possible output buffers are shown; the exemplary buffer stages shown give excellent performance and are representative of the basic variations possible. It is possible to elaborate on the given buffer circuits to devise a different buffer stage without significantly changing the performance the logic gate 10 (FIG. 1) from that given. It is further noted that the representative propagation delays and power dissipation are simulations with temperatures of 25 degrees centigrade, a load on the output of the gate of five identical gates plus 10 femtofarads of capacitance at 500 MHz and $V_{DD}=2.0$ volts.

EXAMPLE 1

Figure 2:
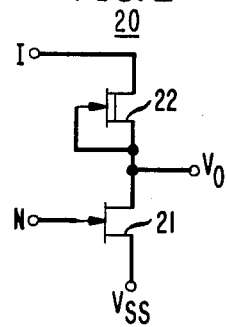
Figure 3:
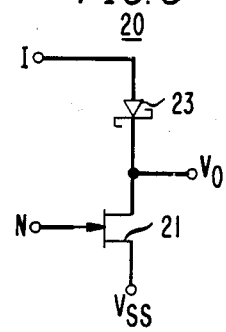
Figure 4:
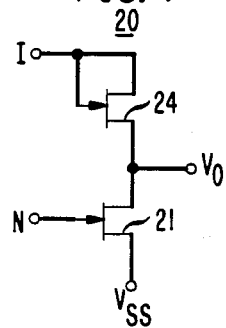

The buffer stages 20 shown in FIGS. 2, 3 and 4 are similar in function and can be discussed together. As discussed above, EFET 21 serves as the pulldown for the output node $V_o$. DFET 22 in FIG. 2 pulls up the voltage on node $V_o$ when node I is "high" and EFET 21 is off. Similarly, in FIG. 3 schottky diode 23 pulls up the output node $V_o$ when node I is high. In FIG. 4 EFET 24, shown here in a diode configuration, also pulls up node $V_o$. However, the DFET 22 of FIG. 2 serves as a current limiter, while the diode 23 and EFET 24 of FIG. 3 and FIG. 4, respectively, provide a voltage drop to ensure that the logical "high" output voltage on node $V_o$ does not exceed a predetermined voltage, typically 1.20 volts, which, if exceeded, cause subsequent logic gates (not shown) coupling to the output node $V_o$ to take excessive input gate current through corresponding EFETs 13 (FIG. 1). The diode 23 and the diode connected EFET 24 in FIGS. 3 and 4, respectively, also allow the I node to be decoupled from the output node $V_o$ when the output of the logic gate changes from logical "high" to "low", reducing transient current flows in the gate 10 and resulting electrical noise. The transient current flow results from the delay in EFET 21 discharging node $V_o$ in response to node N going "high" (and, therefore, node I going "low"). However, diode 23 (EFET 24) reverse biases inhibiting the flow of transient current from node $V_o$ to node I. Using these types of buffers with the input stage 11 of FIG. 1 results in a logic gate 10 having an average delay of 120 picoseconds. The average power dissipation of the logic gate 10 when using the buffer stages shown in FIGS. 2 and 4 is approximately 430 microwatts, while the average power dissipation is approximately 350 microwatts when using the buffer stage 20 of FIG. 3.

EXAMPLE 2

Figure 5:
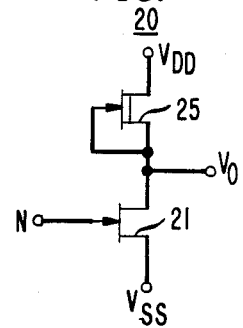

The buffer 20 of FIG. 5 consists of a DFET 25, arranged as a current source with the gate and source terminals thereof coupling to the output node $V_o$ and the drain terminal thereof coupling to $V_{DD}$. DFET 25 then acts as a passive load to EFET 21 to pull-up the voltage on the output node $V_o$. This results in a logic gate 10 having an average propagation delay of 130 picoseconds and an average power dissipation of approximately 700 microwatts.

EXAMPLE 3

The buffer stage 20 of FIG. 6 is a combination of the buffers 20 in FIGS. 3 and 5. DFET 26, corresponding to DFET 25 in FIG. 5, is arranged as a current source to provide a passive load to EFET 21 to pull-up the voltage on the output node $V_o$. In addition, schottky diode 27, corresponding to diode 23 in FIG. 3, assists in speeding up the transition of the output voltage on output node $V_o$ from a logic "low" to logic "high" by recognizing that the voltage on node I changes before the voltage on the output node $V_o$ due to propagation through delay of EFET 21. The logic gate 10 (FIG. 1) using this buffer would have an average propagation delay of 96 picoseconds and an average power dissipation of 650 microwatts.

It is noted that a diode connected EFET (not shown) can be substituted for the schottky diode 27.

EXAMPLE 4

Buffer stage 20 of FIG. 7 has a DFET 28 arranged as a voltage follower (source follower) of the voltage on node I. The source terminal of DFET 28 couples to the output node $V_o$ via schottky diode 29 to drop the voltage on the source terminal of DFET 28 to a lower voltage. The reduction in voltage results in better noise margins for the logical "zero" voltage level to subsequent logic gates. The resulting average propagation delay is approximately 103 picoseconds with an approximate power dissipation of 520 microwatts for the logic gate 10 of FIG. 1.

It is noted that the schottky diode 29 of FIG. 7 can be replaced with a diode-connected EFET (not shown) for a lower voltage drop than possible with a schottky diode.

EXAMPLE 5

Buffer stage 20 of FIG. 8 utilizes an EFET 30 as a voltage follower of the voltage on node I instead of DFET 28 in FIG. 7. A diode-connected EFET 31 couples the source terminal of EFET 30 to the output terminal $V_o$. As with the diode 29 in FIG. 7, EFET 31 drops the voltage on the source terminal of EFET 30 to a lower voltage. Resulting average propagation delay is approximately 98 picoseconds and the approximate power dissipation is 400 microwatts. Replacing the EFET 31 with schottky diode (not shown) does not significantly change the average propagation delay or power dissipation.

END OF EXAMPLES

The approximate threshold voltage of the logic gate 10 (FIG. 1) is determined by the sizes and turn-on voltages $V_t$ of the EFETs 13, DFET 16 (FIG. 1) and EFET 21 (FIGS. 2–8). By threshold voltage of the logic gate we mean the input voltage on inputs A, B (FIG. 1) at which the logic voltage level on the output terminal $V_o$ (FIGS. 2–8) changes state. The approximate threshold voltage is given by:

$$V_{t13} + V_{t21} + \frac{I_o}{g_{m21}W_{21}};$$

where $V_{t13}$ is the turn-on voltage of EFETs 13, $V_{t21}$ the turn-on voltage of EFET 21, $g_{m21}$ is the transconductance of EFET 21, $W_{21}$ is the width of EFET 21 and $I_o$ is the desired output current through node $V_o$ (FIG. 1). Exemplary values for $V_{t13}$ and $V_{t21}$ are 0.2 volts, $I_o$ is 200 microamperes, $g_{m21}$ is 150 microsiemens per micrometer and $W_{21}$ ranges from 8 to 12 micrometers, resulting n the threshold voltage of the logic gate 10 ranging from 0.5 to 0.8 volts.

The propagation delay and power dissipation of the logic gate 10 (FIG. 1) using any of the buffer stages 20 in FIGS. 2–8, are, to an extent, controlled by the current supplied by DFET 15. The primary purpose of DFET 15 serves to limit the current through the gate terminal of EFET 21 (FIGS. 3–8) when the node N is logically "high", forward biasing the gate-source junction thereof. However, the current from DFET 15 also charges capacitive loading on all nodes in the logic gate 10. It is therefore understood that the higher the current allowed by DFET 15, the faster the logic gate 10 is by the faster charging of the capacitive loading but with higher power dissipation. Further, DFET 15 establishes the propagation delay of the gate 10 with minimal effect on the threshold voltage of gate 10.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

What is claimed is:

1. An integrated circuit having at least one logic gate, each logic gate having:
   a logic stage, having at least one logic signal input and first and second output nodes, for performing predetermined logic functions on the logic signal input; and,
   a first depletion FET, with a first output node coupling to a first power source and with a gate terminal and a second output terminal coupling to the first output node of the logic stage, forming a pull-up load for the logic stage;

CHARACTERIZED BY:
   a second depletion FET, with a first output terminal coupling to the second output node of the logic stage and with a gate terminal and a second output terminal coupling to a second power source, forming a pull-down load for the logic stage;
   wherein signals on the first and second output nodes of the logic stage are the logical inverse of each other.

2. The logic gate recited in claim 1, further comprising:
   an output node of the logic gate; and,
   a first enhancement FET, with a gate terminal coupling to the second output node of the logic stage, a first output terminal coupling to the second power source and a second output terminal coupling to the output node of the logic gate.

3. The logic gate recited in claim 2, wherein the logic stage has at least one enhancement FET, each FET having two output terminals and a gate terminal, corresponding output terminals of each FET coupling together to form the first and second output nodes of the logic stage and each gate terminal coupling to the corresponding logic signal input.

4. The logic gate recited in claim 3, whereon the threshold voltage thereof is approximately given by:

$$V_{t13} + V_{t21} + \frac{I_o}{g_{m21}W_{21}};$$

where $V_{t13}$ is the turn-on voltage of the enhancement FETs of the logic stage, $V_{t21}$, $g_{m21}$ and $W_{21}$ are the turn-on voltage, the transconductance and the gate width respectively, of the first enhancement FET and $I_o$ is the desired output current from logic gate.

5. The logic gate recited in claim 4, wherein the depletion FET forming the pull-up load for the logic stage is a double gate depletion FET with common gate terminals.

6. The logic gate recited in claim 2, further characterized by a third depletion FET with a gate terminal and a first output terminal coupling to the output node of the logic gate and with a second output terminal coupling to the first output node of the logic stage.

7. The logic gate recited in claim 2, further characterized by a second enhancement FET with a gate terminal coupling to the first output node of the logic stage and with a second output terminal coupling to the output terminal of the logic gate.

8. The logic gate recited in claim 2, further characterized by a diode disposed between the first output node of the logic stage and the output node of the logic gate.

9. The logic gate recited in claim 2, further characterized by a third depletion FET with a gate terminal and a first output terminal coupled to the output node of the logic gate and with a second output terminal coupled to the first power source.

10. The logic gate recited in claim 9, further characterized by a diode coupling between the output node of the logic gate and the first output node of the logic stage.

11. The logic gate recited in claim 10 wherein the diode is a schottky diode.

12. The logic gate recited in claim 10, wherein the diode is a diodeconnected enhancement FET.

13. The logic gate recited in claim 2, further characterized by:
    a diode coupling to the output node of the logic gate; and
    a third depletion FET with a gate terminal coupling to the first output node of the logic stage, a first output terminal coupling to the first power source and a second output terminal coupling to the diode.

14. The logic gate recited in claim 13, wherein the diode is a schottky diode.

15. The logic gate recited in claim 13, wherein the diode is a diodeconnected enhancement FET.

16. The logic gate recited in claim 2, further characterized by:
    a diode coupling to the output terminal of the logic gate; and,
    a second enhancement FET with a gate terminal coupling to the first output node of the logic stage, a first output terminal coupling to the first power source and a second output terminal coupling to the diode.

17. The logic gate recited in claim 16 wherein the diode is a schottky diode.

18. The logic gate recited in claim 16 wherein the diode is a diodeconnected enhancement FET.

* * * * *